US012687787B2

(12) United States Patent
Lee et al.

(10) Patent No.: US 12,687,787 B2
(45) Date of Patent: Jul. 21, 2026

(54) OPTICAL PROXIMITY CORRECTION METHOD, MASK MANUFACTURING METHOD, SEMICONDUCTOR CHIP MANUFACTURING METHOD USING THE SAME AND COMPUTING DEVICE

(71) Applicant: Samsung Electronics Co., Ltd., Suwon-si (KR)

(72) Inventors: Arin Lee, Suwon-si (KR); Kiho Yang, Seongnam-si (KR); Jeeeun Jung, Yongin-si (KR); Sungyong Moon, Seoul (KR); Junyoung Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 845 days.

(21) Appl. No.: 17/954,975

(22) Filed: Sep. 28, 2022

(65) Prior Publication Data

US 2023/0205092 A1     Jun. 29, 2023

(30) Foreign Application Priority Data

Dec. 27, 2021    (KR) ........................ 10-2021-0188102

(51) Int. Cl.
*G03F 7/00* (2006.01)
*G06F 30/398* (2020.01)

(52) U.S. Cl.
CPC .......... *G03F 7/70441* (2013.01); *G03F 7/705* (2013.01); *G06F 30/398* (2020.01)

(58) Field of Classification Search
CPC ........ G03F 7/70441; G03F 7/705; G03F 1/36; G03F 1/70; G03F 7/70504; G03F 7/70065; G06F 30/398; H01L 21/027

(Continued)

(56) References Cited

U.S. PATENT DOCUMENTS

| | | | |
|---|---|---|---|
| 7,355,681 | B2 | 4/2008 | Laidig et al. |
| 8,381,153 | B2 | 2/2013 | Chiang et al. |

(Continued)

FOREIGN PATENT DOCUMENTS

| | | |
|---|---|---|
| CN | 116360204 A | 6/2023 |
| KR | 10-2007-0056583 A | 6/2007 |

(Continued)

OTHER PUBLICATIONS

Choi et al., "Study on various curvilinear data representations and their impact on mask and wafer manufacturing," Journal of Micro/Nanopatterning, Materials, and Metrology, Nov. 2021, 20(4):041403, 18 pages.

(Continued)

*Primary Examiner* — Paul Dinh
(74) *Attorney, Agent, or Firm* — Fish & Richardson P.C.

(57) ABSTRACT

An optical proximity correction (OPC) method for manufacturing a semiconductor chip including detecting edges of an initial layout pattern and determining an edge violating a mask rule, among the edges, as a target edge, setting a reference control point (RCP) on the target edge, forming a multi-edge by dividing the target edge based on the RCP, setting additional control points on the multi-edge, forming a modified layout pattern by transforming the multi-edge into a curved edge based on the RCP and the additional control points, performing an OPC simulation based on the modified layout pattern, and calculating an edge placement error (EPE) of the modified layout pattern based on a result of the OPC simulation may be provided.

7 Claims, 20 Drawing Sheets

(58) Field of Classification Search
USPC ................................... 716/53; 430/5, 11, 30
See application file for complete search history.

(56) References Cited

U.S. PATENT DOCUMENTS

| | | | |
|---|---|---|---|
| 8,631,361 B2 | 1/2014 | Feng | |
| 8,739,080 B1 | 5/2014 | Tsai et al. | |
| 10,036,948 B2 | 7/2018 | Cheng et al. | |
| 10,684,544 B2 | 6/2020 | Choi et al. | |
| 2003/0008215 A1* | 1/2003 | Mukherjee | G03F 7/70441 |
| | | | 430/5 |
| 2010/0055580 A1 | 3/2010 | Fujimura et al. | |
| 2014/0355884 A1* | 12/2014 | Tran | G06V 30/224 |
| | | | 382/188 |
| 2021/0240087 A1 | 8/2021 | Yu | |
| 2021/0404826 A1* | 12/2021 | Yu | A63F 13/422 |
| 2023/0185183 A1* | 6/2023 | Hu | G03F 7/70683 |
| | | | 430/5 |
| 2024/0310718 A1* | 9/2024 | Hamouda | G03F 7/70441 |

FOREIGN PATENT DOCUMENTS

| | | |
|---|---|---|
| KR | 10-2019-0073064 A | 6/2019 |
| KR | 10-2023-0099054 A | 7/2023 |
| TW | 201923442 A | 6/2019 |
| TW | 202122910 A | 6/2021 |
| WO | WO 2021244820 A1 | 12/2021 |

OTHER PUBLICATIONS

Office Action in Korean Appln. No. 10-2021-0188102, mailed on Aug. 11, 2025, 11 pages (with English translation).
Office Action in Taiwanese Appln. No. 111148398, mailed on May 29, 2026, 26 pages (with machine translation).

\* cited by examiner

DR

401

'A'

Layout pattern

Target pattern

ACI pattern

| | Layout pattern |
|---|---|
| | ACI pattern |

608b 609    608b

| | Initial layout pattern |
| | Multi-edge |
| | Modified layout pattern |

DR

MRC

☐ Layout pattern
▦ ACI pattern

70nm

70nm 66.97nm 69.33nm

3nm

———  —  ———  Target center
———————————  Contour center

< 0.5nm

———  —  ———  Target center
———————————  Contour center

PERFORM OPC —S610

INPUT MTO DESIGN DATA —S620

PREPARE MASK DATA —S630

PERFORM PEC ON MASK DATA —S640

EXPOSE SUBSTRATE FOR MASK —S650

FORM EUV MASK —S660

MANUFACTURE SEMICONDUCTOR CHIP —S670

OPTICAL PROXIMITY CORRECTION METHOD, MASK MANUFACTURING METHOD, SEMICONDUCTOR CHIP MANUFACTURING METHOD USING THE SAME AND COMPUTING DEVICE

CROSS-REFERENCE TO RELATED APPLICATION(S)

This application claims benefit of priority to Korean Patent Application No. 10-2021-0188102 filed on Dec. 27, 2021 in the Korean Intellectual Property Office, the disclosure of which is incorporated herein by reference in its entirety.

BACKGROUND

The present disclosure relates to an optical proximity correction (OPC) method, and a mask manufacturing method, and/or a semiconductor chip manufacturing method using the same and a computing device.

In general, patterns of semiconductor chips are formed by a photolithography process and an etching process. First, a pattern is designed, and a layout of the pattern is formed on a wafer to make a semiconductor chip. When a circuit pattern is transferred onto a wafer from a mask through the photolithography process to form a circuit pattern (hereinafter, referred to as a "transferred circuit pattern") on the wafer, there may be differences between the transferred circuit pattern on the wafer and the designed circuit pattern on the mask. Such differences may be due to an optical proximity effect in the photolithography process or a loading effect in the etching process.

As a method for accurately transferring a circuit pattern on a mask onto a wafer, a process proximity correction (PPC) technology for correcting a circuit pattern on a mask in consideration of deformation of a transferred circuit pattern on the wafer is used. The process proximity correction technology predicts and analyzes the optical proximity effect and the loading effect in advance and corrects the layout of the circuit pattern on the mask according to an analysis result, and an optical proximity correction (OPC) method is mainly used in the photolithography process.

The OPC method is divided into model-based OPC and rule-based OPC. The model-based OPC is a method of correcting a circuit pattern of a mask by applying one model to all chips (full-chip) on a wafer. The rule-based OPC is a method of correcting a circuit pattern of a mask by applying a single rule to all chips on a wafer.

SUMMARY

Some example embodiments provide an optical proximity correction (OPC) method for manufacturing a semiconductor chip, a mask manufacturing method, and/or a semiconductor chip manufacturing method, a computing device and the like using the same.

Some example embodiments provide an OPC method for highly integrating devices on a semiconductor wafer while allowing a layout pattern on a mask to avoid violation of a mask rule, a mask manufacturing method, and/or a semiconductor chip manufacturing method.

Some example embodiments provide an OPC method for reducing an edge placement error (EPE) of a layout pattern on a mask, a mask manufacturing method, and/or a semiconductor chip manufacturing method.

According to an example embodiment, an optical proximity correction (OPC) method for manufacturing a semiconductor chip may include detecting edges of an initial layout pattern and determining an edge violating a mask rule, among the edges, as a target edge, setting a reference control point on the target edge, forming a multi-edge by dividing the target edge based on the reference control point, setting additional control points on the multi-edge, forming a modified layout pattern by transforming the multi-edge into a curved edge based on the reference control point and the additional control points, performing an OPC simulation based on the modified layout pattern, calculating an edge placement error (EPE) of the modified layout pattern based on a result of the OPC simulation, iteratively performing moving the reference control point on the target edge and the forming the multi-edge based on the moved reference control point, the setting additional control points, the forming a modified layout pattern, the performing an OPC simulation, and the calculating an EPE for a set number of iterations, and determining a final layout pattern based on EPE calculation results.

According to an example embodiment, a method of manufacturing a semiconductor chip may include designing a layout for the semiconductor chip, performing optical proximity correction (OPC) on the layout, manufacturing a mask after performing the OPC, and manufacturing the semiconductor chip using the mask. The mask may include a plurality of layout patterns corresponding to a rectangular pattern, and at least one of the plurality of layout patterns may have an edge formed by a Bezier curve or a B-spline curve.

According to an example embodiment, a method of manufacturing a mask for a semiconductor chip may include performing optical proximity correction (OPC) on a layout, inputting mask tape-out (MTO) design data after performing the OPC, preparing mask data after inputting the MTO design data, performing an exposure process on a substrate for the mask based on the mask data using electron beam after preparing the mask data, and performing a development, etching or cleaning process to form the mask after performing the exposure process. The performing OPC may include determining an edge violating a mask rule in a rectangular layout pattern of the mask as a target edge, setting a reference control point on the target edge, forming a multi-edge by dividing the target edge based on the reference control point, setting additional control points on the multi-edge, and forming a modified layout pattern by transforming the multi-edge into a curved edge based on the reference control point and the additional control points.

According to an example embodiment, a computing device performing an optical proximity correction (OPC) on a layout of a semiconductor chip may include a memory configured to store at least one instruction, and a processor configured to execute the at least one instruction such that an OPC shape is formed by transforming a target edge, among edges of a rectangular pattern, into a multi-edge in the layout, and transforming the multi-edge into a Bezier curve or a B-spline curve based on control points set on the multi-edge.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

Figure 1:
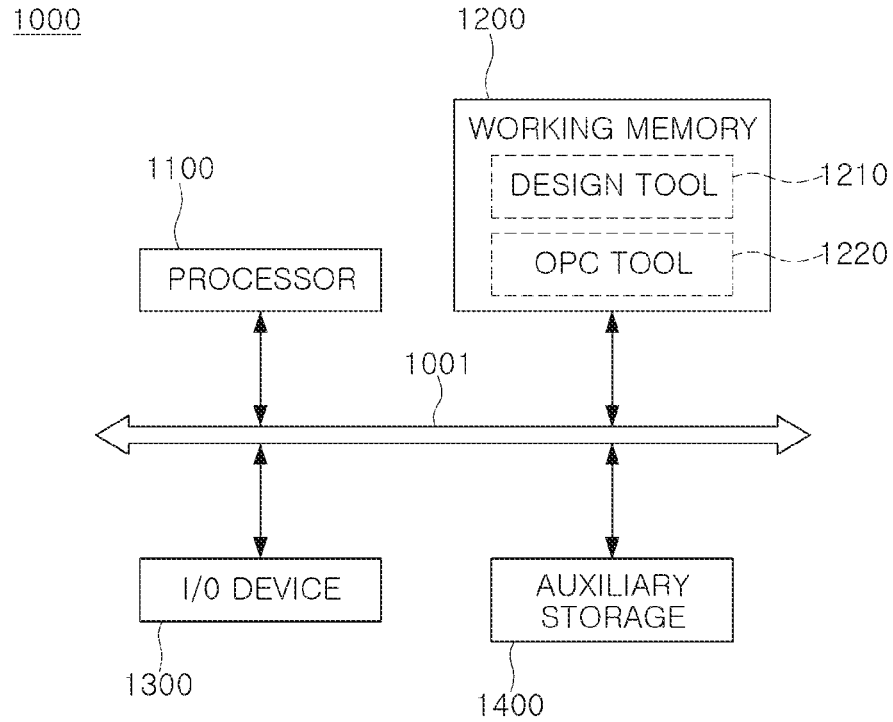
FIG. 1 is a block diagram illustrating a computing system performing optical proximity correction (OPC) according to an example embodiment.

FIG. 1 is a block diagram illustrating a computing system 1000 performing optical proximity correction (OPC) according to an example embodiment. Referring to FIG. 1, a computing system 1000 may include at least one processor 1100 connected to a system bus 1001, a working memory 1200, an input/output (I/O) device 1300, and an auxiliary storage device 1400.

For example, the computing system 1000 may be provided as a dedicated device for a method of generating/correcting an OPC model or as a dedicated device for performing semiconductor design including the same. For example, the computing system 1000 may include various design and verification simulation programs. The processor 1100, the memory device 1200, the I/O device 1300, and the auxiliary storage 1400 may be electrically connected through the system bus 1001 and exchange data with each other. However, a configuration of the system bus 1001 is not limited to the above description, and may further include mediation units for efficient management.

The processor 1100 may be implemented to execute at least one instruction. For example, the processor 1100 may be implemented to execute software (application programs, operating systems, and device drivers) to be executed in the computing system 1000. The processor 1100 may execute an operating system loaded into the memory device 1200. The processor 1100 may execute various application programs to be driven based in the operating system. For example, the processor 1100 may be a central processing unit (CPU), a microprocessor, an application processor (AP), or any processing device similar thereto.

The working memory 1200 may be implemented to store at least one instruction. For example, the working memory 1200 may be loaded with an operating system or application programs. When the computing system 1000 is booted, an OS image stored in the auxiliary storage 1400 may be loaded to the working memory 1200 based on a booting sequence. General I/O operations of the computing system 1000 may be supported by the operating system. Similarly, application programs may be loaded to the working memory 1200 to be selected by a user or to provide a basic service. For example, as described above, a design tool 1210 for semiconductor design or an OPC tool 1220 for a layout pattern dividing method and an OPC method may be loaded from the auxiliary storage 1400 to the working memory 1200.

In addition, the working memory 1200 may be a volatile memory such as a dynamic random access memory (DRAM), a static random access memory (SRAM), or the like, or a nonvolatile memory such as a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The design tool 1210 may perform a function of changing the shapes and positions of specific layout patterns to be different from those defined by a design rule (DR). Also, the design tool 1210 may perform a design rule check (DRC) in a changed bias data condition.

The OPC tool 1220 may perform an OPC function on a layout pattern. For example, the OPC tool 1220 may correct a rectangular pattern into one of a plurality of OPC shapes depending on a condition.

According to an example embodiment, the OPC tool 1220 may select targets from among rectangular layout patterns using a mask rule check (MRC) to perform OPC on the selected targets.

The I/O device 1300 may control user input and output from user interface devices. For example, the I/O device 1300 may include input units such as a keyboard, a keypad, a mouse, and a touchscreen to receive information from a designer. Using the I/O device 1300, the designer may receive information on a semiconductor region or data paths requiring adjusted operating characteristics. In addition, the I/O device 1300 may include an output unit such as a printer or a display to display a processing process and results of the design tool 1210 or the OPC tool 1220.

The auxiliary storage 1400 may be provided as a storage medium of the computing system 1000. The auxiliary storage 1400 may store application programs, an OS image, and various types of data. The auxiliary storage 1400 may be provided in the form of a mass storage device such as a memory card (MMC, eMMC, SD, Micro SD, or the like), a hard disk drive (HDD), a solid state drive (SSD), a universal flash storage (UFS), or the like.

When layout patterns are designed, operating characteristics of devices are determined by a design rule (DR). In the design rule, items for a gap between devices, a minimum feature size of conductive patterns, and an expanding region or area are defined basically.

For example, a gap between layout patterns defined in a design rule may be reduced to reduce a size of a semiconductor chip. An exposure process may be performed to form layout patterns on a semiconductor wafer. The exposure process may be performed based on the layout patterns. For example, it is desirable to secure a minimum gap defined in a mask rule (MR) even between the layout patterns to mitigate or prevent defects of the layout patterns.

When the gap defined in the mask rule is not secured between the layout patterns, the layout pattern may be determined to violate the mask rule. A method of cutting a corner portion in a layout pattern, adjacent to another layout pattern, to mitigate or prevent the layout pattern from violating a mask rule may be considered. However, according to the above-mentioned method, a total area of the layout pattern may be reduced, and a wafer may not receive a sufficient amount of light through the layout pattern during a wafer exposure process. Accordingly, a transfer circuit pattern formed on the wafer may not have a sufficient size of a target pattern, resulting in an edge placement error (EPE). Also, a method of collectively forming layout patterns in a circular shape having no corner to mitigate or prevent the layout patterns from violating a mask rule may be considered. However, when an exposure process is performed on a wafer using the layout patterns formed by the above method, transfer circuit patterns may be formed on the wafer to be close to each other, resulting in a bridge between the transfer circuit patterns.

In the OPC method according to an example embodiment, layout patterns violating a mask rule may be detected and edges violating the mask rule in the detected layout patterns may be modified to curved edges using a multi-order function curve such as a Bezier curve or a B-spline curve. According to an example embodiment, an edge violating a mask rule in the layout pattern may be modified to a curved edge to avoid violation of the mask rule of the layout pattern and to alleviate an EPE.

Figure 2:
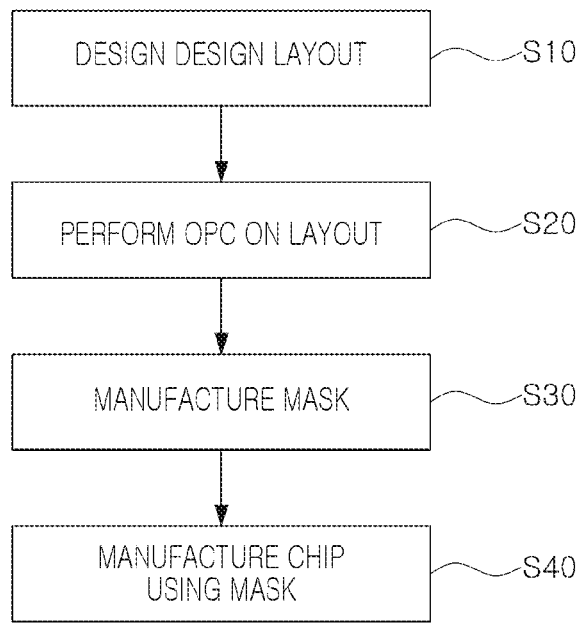
FIG. 2 is a flowchart illustrating a method of manufacturing a semiconductor chip according to an example embodiment.

FIG. 2 is a flowchart illustrating a method of manufacturing a semiconductor chip according to an example embodiment.

Referring to FIG. 2, the method of manufacturing a semiconductor chip may include an operation S10 of designing a design layout of a semiconductor chip, an operation S20 of performing OPC and position correction on the design layout, an operation S30 of manufacturing a mask using the corrected design layout, and an operation S40 of manufacturing a semiconductor chip using the mask.

In the operation S10 of designing a design layout of the semiconductor chip, a design layout corresponding to a circuit pattern of the semiconductor chip to be formed on a wafer may be provided from a host computer or server of a semiconductor manufacturing facility. For example, the layout is a physical indication for a circuit designed for a semiconductor chip to be transferred onto a wafer, and may include a plurality of patterns. For example, the design layout may be provided as coordinate values of a contour of patterns constituting the design layout from a computer aided design (CAD) system. For example, the patterns may include multiple patterns in which the same shape is iterated, and the patterns may be provided in the form of a combination of polygons such as a triangle and a quadrangle.

In the operation S20 of performing OPC and position correction on the design layout may include an OPC operation and a position correction operation, respectively performed as separate operations. The OPC refers to correction performed by changing patterns, included in a design layout, by reflecting an error caused by the optical proximity effect (OPE). As patterns grow finer, an optical proximity phenomenon may occur due to an influence between neighboring patterns during an exposure process.

Therefore, the optical proximity effect may be suppressed by performing the OPC for correcting the design layout. For example, the OPC may include expanding an overall size of patterns constituting the design layout and processing a corner portion. For example, OPC may include moving/shifting the corners of each pattern or adding additional polygons. By the OPC, a distortion phenomenon of a pattern due to diffraction and interference of light generated during exposure may be corrected and an error caused by a pattern density may be corrected. After the OPC operation, an OPC correction verification operation may be further performed.

The position correction may include moving/shifting a position of an optical-proximity-corrected pattern in consideration of physical deformation and change of a lower structure in which the patterns are to be aligned. Deformation of the lower structure occurs due to factors during the manufacturing process of the semiconductor chip. The deformation of the lower structure may cause progressive misalignment in which the actual pattern positions of the patterns of the lower structure are changed from the original layout. The position correction may be moving/changing only the position, without changing a shape of the optical-proximity-corrected pattern.

Final design layout data corrected by OPC and position correction may be transmitted to an exposure facility for the manufacturing of masks for lithographic processes, such as photomasks and electron beam masks. The operation S30 of manufacturing a mask using the corrected design layout may be an operation of manufacturing a mask based on the corrected design layout data. A mask may be manufactured by performing an exposure process on the substrate for a mask using the corrected design layout data. After the exposure process, for example, a mask may be formed by further performing a series of processes such as development, etching, cleaning, and baking. In an example embodiment, before transmitting the corrected design layout data, a verification operation may be further performed on the corrected design layout data.

The operation S40 of manufacturing a semiconductor chip using a mask may include performing a lithography process using a mask. The semiconductor chip may include or may be a volatile memory such as a dynamic random access memory (DRAM), a static random access memory (SRAM), or the like, or a nonvolatile memory such as a flash memory, and/or may include or may be a logic semiconductor device, such as a micro-processor, for example, a central processing unit (CPU), a controller, or an application specific integrated circuit (ASIC). For example, the semiconductor chip may be manufactured by performing a process of forming second iterated patterns on the lower structure including the first iterated patterns. The second iterated patterns may be formed by being aligned with the first iterated patterns with high accuracy by a mask. The semiconductor chip may be finally manufactured by further performing a deposition process, an etching process, an ion process, a cleaning process, and the like in addition to the lithography process.

In general, the OPC method may be a method of suppressing occurrence of an optical proximity effect (OPE) by correcting a layout of a pattern to overcome the OPE occurring during an exposure process, due to an influence between neighboring patterns as patterns are miniaturized. Such an OPC method may be divided into two types. One is a rule-based OPC method, and the other is a simulation-based or model-based OPC method. The OPC method of some example embodiments may be, for example, a model-based OPC method. The model-based OPC method may be advantageous in terms of time and cost because it uses only measurement results of representative patterns, without measuring all or a large number of test patterns.

When mask data is input to the OPC model, a contour of a transfer circuit pattern to be transferred to the wafer may be predicted through simulation. The OPC model is a simulation model for predicting the contour of the transfer circuit pattern, and various types of basic data may be input to the OPC model as input data. The basic data may include mask data for a fragment. In addition, the basic data may include information data such as thickness, refractive index, and dielectric constant of a photoresist (PR), and may include data of a source map for a shape of an illumination system. The basic data is not limited to the above described examples. The mask data may include not only fragment data, but also data such as shapes of patterns, positions of patterns, types of measurements (measurements for space or lines) of patterns, and basic measurement values.

Figure 3:
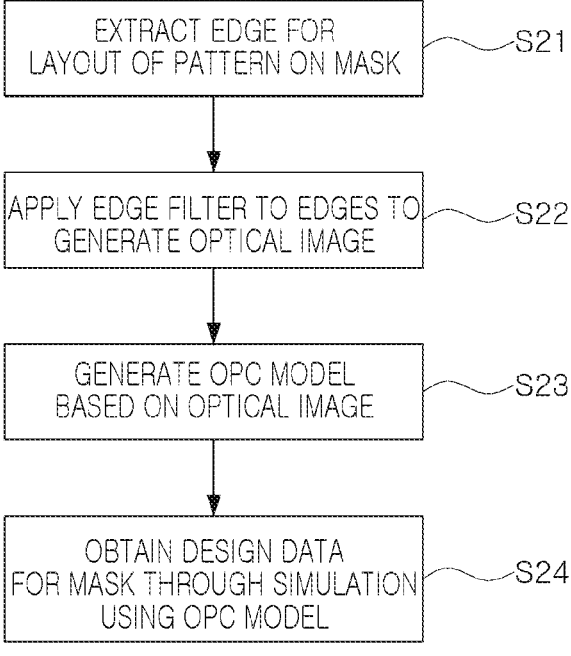
FIG. 3 is a flowchart illustrating an OPC method illustrated in FIG. 2.

FIG. 3 is a flowchart illustrating an OPC method illustrated in FIG. 2.

Referring to FIG. 3, the OPC method according to the present example embodiment may start with an operation S21 of extracting edges for a layout of a pattern on a mask. The pattern on the mask may refer to a pattern which may be transferred onto a substrate such as a wafer through an exposure process to form a target pattern on the substrate. For example, a shape of the target pattern on the substrate may be different from a shape of the pattern on the mask in terms of the characteristics of the exposure process. Also, because the pattern on the mask is reduced-projected and transferred onto the substrate, the pattern on the mask may have a larger size than the target pattern on the substrate.

The layout of the pattern on the mask may have a 1D or 2D shape. The 1D shape may not refer to a line without an area, but may refer to a shape extending in one direction, such as a line-and-space pattern. For example, the 1D shape may be a shape of pattern extending in a direction. The 2D shape may be a shape of pattern extending two dimensionally, for example, in a plan view. Edges may correspond to lines surrounding an outer area/edge of the layout of the pattern. According to an example embodiment, the edges may correspond to lines surrounding a space between layouts of a pattern. In certain example embodiments, the edges may correspond to both lines surrounding an outer portion of the layout of the pattern and lines surrounding the space.

Next, an optical image is generated by applying an edge filter to the extracted edges (S22). The optical image may be a mask near field image calculated on a rear surface of the mask immediately after light has passed through the mask. The edge filter is a filter capable of generating an optical image of a portion corresponding to the edges, and the value of the edge filter may vary depending on the positions and characteristics of the edges. An edge filter corresponding to each of the edges may be applied to generate an optical image corresponding to each of the edges.

Hereinafter, the generating of the optical image for the pattern on the mask will be described in greater detail. In order to overcome the recent patterning limitation and secure a process margin, the shapes of the patterns on the masks expand from an orthogonal shape to include curvilinear shapes. In addition, research into the OPC method for such curvilinear patterns has been actively conducted. For example, the pattern on the mask may have a thickness, which is not negligible, as compared with an exposure wavelength. Accordingly, for precise OPC, it is beneficial to calculate an optical image in consideration of a mask topography effect, for example, a mask 3D effect. In order to perform OPC on a large-area mask, calculation of an optical image should be performed fast to complete the OPC over the whole large-area mask within a short time, e.g. for cost effectiveness purposes. Therefore, it may not be appropriate to use a rigorous simulation method that takes a lot of time to calculate the optical image. Here, the rigorous simulation method may be, for example, an electromagnetic field simulation method such as rigorous coupled-wave analysis (RCWA) or finite difference time domain (FDTD) simulation. In the case of such a rigorous simulation method, a mask near-field image accurately reflecting the shape of the pattern on the mask may be obtained.

Accordingly, an optical image of the mask is calculated using a compact simulation model, and the most commonly used method is a domain decomposition method (DDM). The DDM is a method of dividing a pattern on a mask into domains and obtaining an optical image of each domain using edge filter approximation.

For example, the DDM is a method of storing edge filter values calculated for each width/space of a pattern through FDTD simulation in advance in a filter library and retrieving an edge filter value corresponding to each edge from the filter library to use it to calculate an optical image for each pattern, thereby calculating an optical image that is substantially similar to an optical image calculated through rigorous simulation.

Therefore, the DDM may generate an optical image that effectively corrects the 3D effect of the mask. The optical image using edge filter approximation may include a first optical image based on thin mask approximation (TMA) and a second optical image using an edge filter. For example, a final optical image of the corresponding pattern may be generated by combining the first optical image and the second optical image. For reference, the TMA may be the Kirchhoff approximation and may be a near field image calculated on an assumption that a thickness of the mask is as thin as being almost absent and a perforated portion allows light to completely pass therethrough and a blocking portion completely blocks light.

The OPC method may generate an optical image by applying an any-angle filter corresponding to a portion of an edge of a curve, and may thus generate an optical image in which the mask 3D effect is effectively corrected. Optimal design data for the mask may be obtained by generating an OPC model based on the optical image and performing a simulation using the OPC model. Furthermore, the OPC method of an example embodiment enables a reliable high-quality mask to be manufactured, based on the optimal design data for the mask obtained using the OPC method, thereby significantly contributing to improvement of performance and reliability of a product using the mask for patterning of the product ultimately.

The OPC method according to an example embodiment may detect layout patterns violating a mask rule when OPC is performed and may modify edges, which violates the mask rule, in the detected layout patterns into curved edges, which do not violate the mask rule, using a multi-order function curve such as a Bezier curve or a B-spline.

After the optical image is generated, an OPC model is generated based on the optical image (S23). After the optical OPC model is generated, an OPC model for the PR is generated. The generating of an OPC model for PR may include optimization of a threshold for PR. The threshold of the PR may be a threshold at which a chemical change occurs in the layer of the PR during an exposure process, and for example, the threshold may be given as an intensity of exposure light. Generating of an OPC model for PR may also include selecting an appropriate model form from several PR model forms. The optical OPC model and the OPC model for PR are collectively referred to as an OPC model. Therefore, a combination of both a process of generating the optical OPC model and a process of generating the OPC model for PR may be called a process of generating an OPC model, for example, an OPC modeling process. Hereinafter, the term OPC model is used as a concept of a combination of the optical OPC model and the OPC model for PR.

Thereafter, design data for the mask is obtained through simulation using the OPC model (S24). After the OPC model is generated, the OPC model is verified. The verification of the OPC model may be performed through edge placement error (EPE) check, or the like. When the OPC model satisfies specifications, the OPC model verification may be completed and the corresponding OPC model may be selected as an OPC model for simulation. When the OPC model does not satisfy the set specifications, the process of generating the OPC model, for example, the process of generating the optical OPC model or the OPC model for PR is performed again.

After the OPC model is verified, simulation is performed using the corresponding OPC model. Design data of a mask close to an actual measurement may be obtained through simulation using the OPC model. The design data of the mask obtained through the simulation may be transmitted to a mask manufacturing team as mask tape-out (MTO) design data for subsequent mask manufacturing.

As described above, the process of generating an optical image, generating an OPC model, and acquiring design data is known as an OPC method. The OPC method according to an example embodiment may have a plurality of OPC shapes with respect to a rectangular pattern.

Figure 4A:
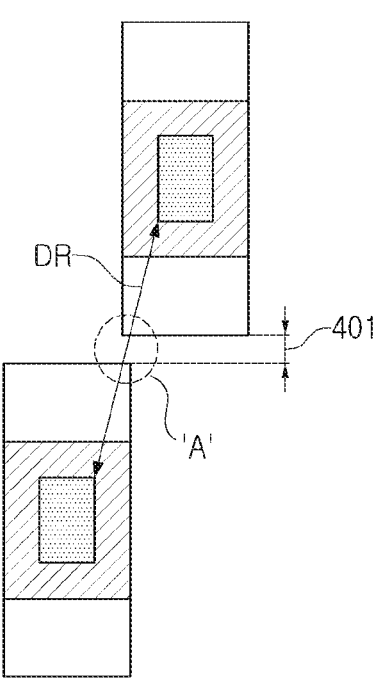
FIGS. 4A and 4B are views illustrating an OPC method according to a comparative example, different from an example embodiment.
Figure 4B:
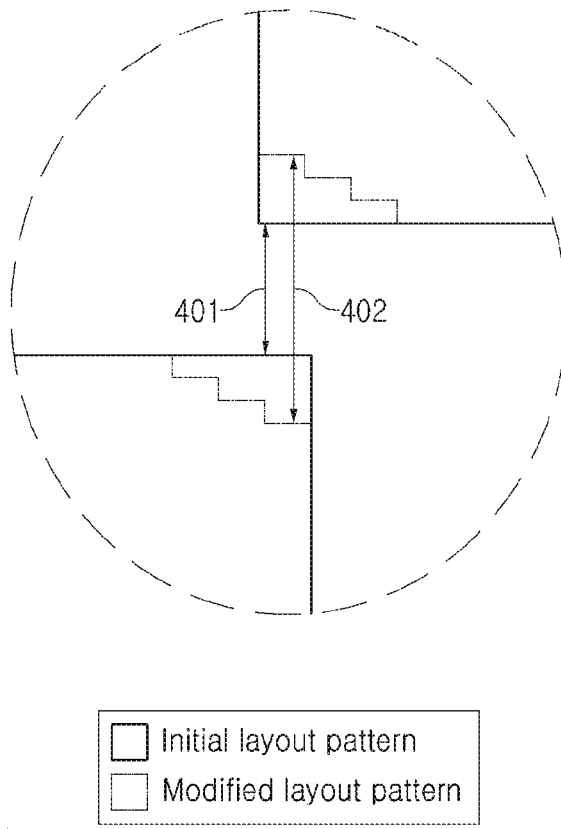

FIGS. 4A and 4B are views illustrating an OPC method according to a comparative example, different from an example embodiment.

The semiconductor design layout may include a plurality of layout patterns. FIG. 4A illustrates two layout patterns, adjacent to each other in a diagonal direction, among a plurality of layout patterns.

As described with reference to FIG. 3, a shape of a target pattern on a substrate and a shape of a layout pattern on a mask may be different from each other in terms of characteristics of an exposure process. For example, the layout pattern on the mask may have a size, larger than a size of the target pattern on the substrate. In addition, a pattern after the exposed pattern on the substrate is etched (after cleaning inspection (ACI)) may have a size, smaller than a size of the target pattern. FIG. 4A illustrates two adjacent layout patterns, a target pattern, and an ACI pattern.

The layout patterns may be designed such that ACI patterns generated by the layout patterns may satisfy a desired (or alternatively, predetermined) design rule. As semiconductors tend to be highly integrated, a gap DR between ACI patterns required by the design rule may also tend to be reduced.

The layout patterns should not violate the mask rule while satisfying the design rule. FIG. 4A illustrates a case in which a gap 401 between layout patterns in corner portions of layout patterns, adjacent to each other in a diagonal direction, violate the mask rule.

FIG. 4B is an enlarged view of portion "A" of the layout patterns illustrated in FIG. 4A. FIG. 4B is a diagram illustrating a method of modifying a layout pattern based on an OPC method according to a comparative example.

In the OPC method according to the comparative example, when the gap 401 between layout patterns violates a mask rule, a corner portion violating the mask rule may be cut to form a modified layout pattern. In FIG. 4B, a modified layout pattern having cut corner portions is illustrated by two-dot chain lines. In addition, a gap 402 between the modified layout patterns is illustrated so as not to violate the mask rule.

When the modified layout pattern is formed using the OPC method according to the comparative example, an area of the layout pattern may be reduced because a corner portion of the layout pattern is cut. When the area of the layout pattern is reduced, an intensity of light reaching a wafer through the layout pattern in an exposure process of a wafer is reduced, so that a contour of a transfer circuit pattern formed on the wafer may not reach a size of a target pattern.

Figure 5:
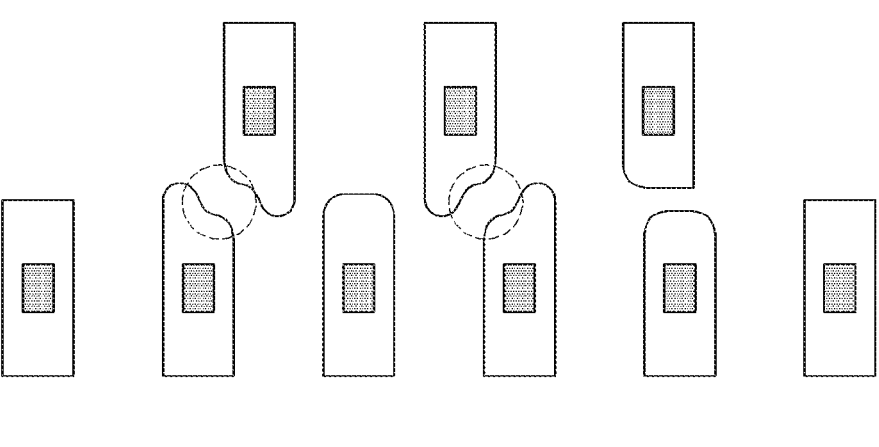
FIG. 5 is a schematic view illustrating layout patterns formed by an OPC method according to an example embodiment.

FIG. 5 is a schematic view illustrating layout patterns formed by an OPC method according to an example embodiment.

According to an example embodiment, when a gap between adjacent layout patterns violates a mask rule, edges violating the mask rule in the layout patterns may be modified to be curved edges to avoid violation of the mask rule. Regions represented by two-dot chain lines in FIG. 5 denote layout patterns modified according to an example embodiment.

Hereinafter, an OPC method according to an example embodiment will be described in detail with reference to FIGS. 6A to 13.

Figure 6A:
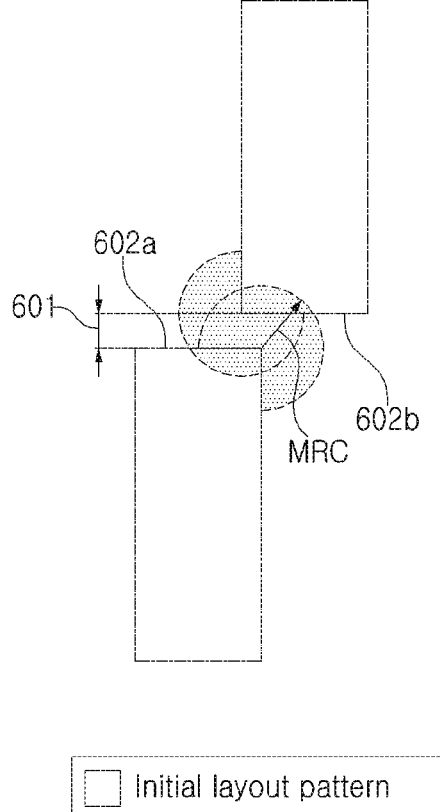
FIGS. 6A to 6C are detailed views illustrating an OPC method according to an example embodiment.
Figure 6B:
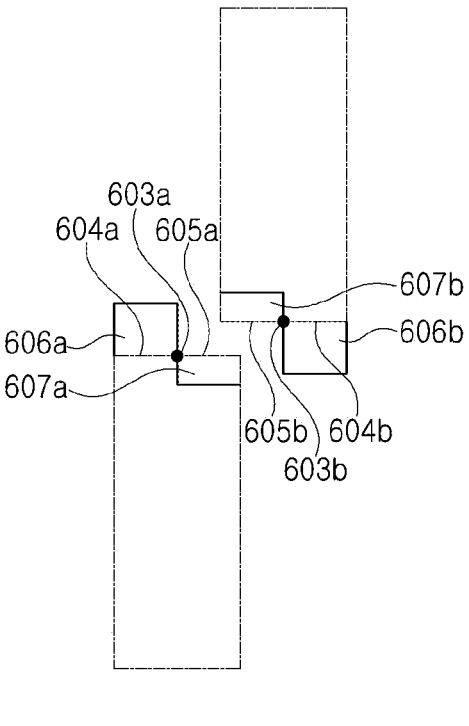
Figure 6C:
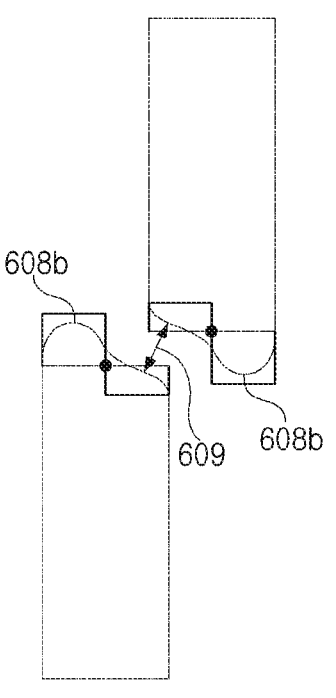

FIGS. 6A to 6C are detailed views illustrating an OPC method according to an example embodiment.

Referring to FIG. 6A, a pair of edges having a gap that is within a gap defined by a mask rule may be detected from adjacent initial layout patterns.

FIG. 6A illustrates layout patterns, adjacent to each other in a diagonal direction, among initial layout patterns formed from a design layout before OPC is performed. The initial layout patterns may have a rectangular shape, and may include edges and corners.

A mark rule check (MRC) may be performed on the initial layout patterns to detect the pair of edges having a gap that is within (or less than) a gap defined in the mask rule. For example, the MRC may be performed to check whether another layout pattern is disposed within a desired (or alternatively, predetermined) radius from corners of the initial layout patterns having a polygonal shape. FIG. 6A illustrates a case in which adjacent layout patterns are arranged within a desired (or alternatively, predetermined) radius from a corner of a certain layout pattern. When adjacent layout patterns are arranged within a desired (or alternatively, predetermined) radius from the corner, the corresponding layout patterns may be determined to violate the mask rule. In addition, among edges of the layout patterns violating the mask rule, a pair of edges 602a and 602b facing each other and having a gap 601 that is within a desired (or alternatively, predetermined) gap may be detected. In other words, an edge violating a mask rule is determined as a target edge when the initial layout pattern (e.g., a corner of the initial layout pattern) is within a distance defined in the mask rule from a corner of an adjacent layout pattern.

Referring to FIG. 6B, each edge of the detected pair of edges may be modified to a multi-edge.

FIG. 6B illustrates a multi-edge formed by modifying each of a pair of edges in the initial layout pattern.

A reference control point may be formed on each of the pair of edges, and each edge may be divided based on the reference control point and then transformed into a multi-edge. For example, FIG. 6B illustrates first edges 604a and 604b divided based on reference control points 603a and 603b generated on each edge, and first edges 604a and 604b and second edges 605a and 605b divided based on the reference control points 603a and 603b. FIG. 6B illustrates a case in which a reference control point is set at a midpoint of each edge. However, example embodiments are not limited thereto, and the reference control point may be freely move on each edge.

Among the edges divided based on the reference control point, an edge of the initial layout pattern that is relatively more distant from an adjacent layout pattern is referred to as a first edge, and an edge of the initial layout pattern that is relatively closer to the adjacent layout pattern is referred to as a second edge. In adjacent layout patterns, each of the pair of edges may be transformed into a multi-edge by adding rectangular patterns 606a and 606b in contact with the first edges 604a and 604b and cutting the square patterns 607a and 607b in contact with the second edges 605a and 605b. In FIG. 6B, the multi-edge is represented by solid lines. Sizes of the added square patterns 606a and 606b and the cut rectangular patterns 607a and 607b may be freely changed.

Referring to FIG. 6C, a multi-edge may be transformed into a curved edge.

In FIG. 6C, modified layout patterns including curved edges generated by transforming respective edges of a multi-edge constituting a pair are illustrated by two-dot chain lines.

A plurality of additional control points may be formed on each edge of the multi-edge to form curved edges based on each edge of the multi-edge. Curved edges 608a and 608b may be formed based on the reference control point and the additional control points of each edge of the multi-edge. For example, the curved edge may correspond to a Bezier curve or a B-spline curve based on the control points.

According to an example embodiment, in the initial layout pattern, an area of a second edge portion disposed to be close to an adjacent layout pattern may be reduced. Accordingly, the gap 609 between the modified layout patterns may be increased, and adjacent layout patterns may satisfy the mask rule.

In addition, in the initial layout pattern, an area of the first edge portion relatively distant from the adjacent layout pattern may be increased. Thus, an entire area of the layout pattern may be maintained, and a sufficient amount of light to form a transfer circuit pattern appropriate for a size of the target pattern may reach the wafer through the layout pattern. For example, a size of the EPE, representing a difference between the size of the target pattern and the size of the contour of the transfer circuit pattern, may be reduced.

Figure 7:
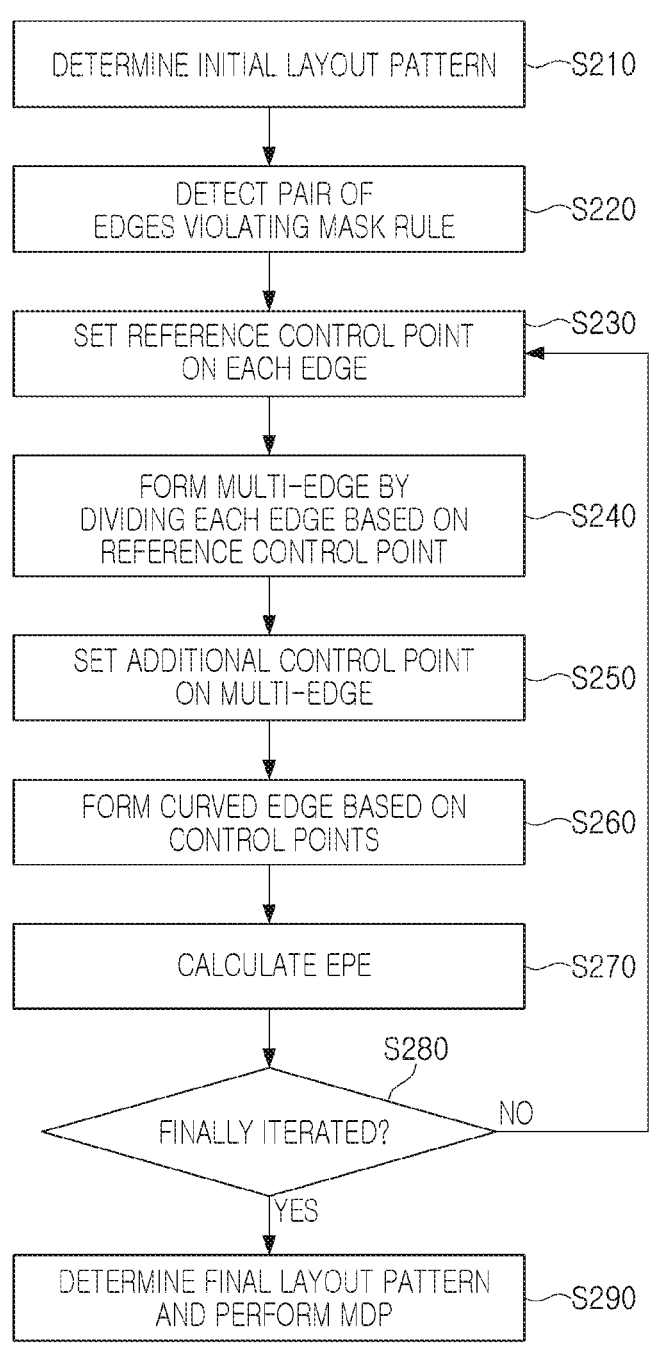
FIG. 7 is a flowchart illustrating an example of an OPC method according to an example embodiment.

FIG. 7 is a flowchart illustrating an example of an OPC method according to an example embodiment.

Initial layout patterns may be determined based on a designed layout (S210). An MRC may be performed on the initial layout patterns to detect a pair of edges violating a mask rule (S220). A reference control point may be set on each of the pair of edges (S230). Each edge may be divided based on a reference control point, and a multi-edge may be formed based on the divided edges (S240). A method of forming the multi-edge has been described in detail with reference to FIG. 6B. Additional control points may be set on the multi-edge (S250). A curved edge may be formed based on the reference control point and the additional control points (S260). OPC simulation using modified layout patterns having modified curved edges may be performed, and EPE may be calculated based on a result of the simulation (S270).

When the number of iterations of operations S230 to S270 does not reach the end of the set number of iterations ("No" of S280), operations S230 to S270 may be iteratively performed. For example, whenever operations S230 to S270 are iteratively performed, a position of the reference control point may be changed, a shape of a multi-edge may be changed, or the number or positions of additional control points for generating a curved edge may be changed. As long as the mask rule is not violated, various types of modified layout patterns may be generated and EPE for the modified layout patterns may be calculated.

When the number of iterations of operations S230 to S270 reaches the end of the set number of iterations ("Yes" of S280), a layout pattern having a minimum EPE, among various types of modified layout patterns, may be determined as a final layout pattern and mask data preparation (MDP) may be performed on the final layout pattern (S290). In other words, the OPC may be iteratively performed to generate a plurality of modified layout patterns and a specific modified layout pattern having a minimum EPE may be determined as a final layout pattern the EPE FIGS. 8A and 8B are views illustrating a comparison between a rectangular layout pattern and a modified layout pattern according to an example embodiment.

Figure 8A:
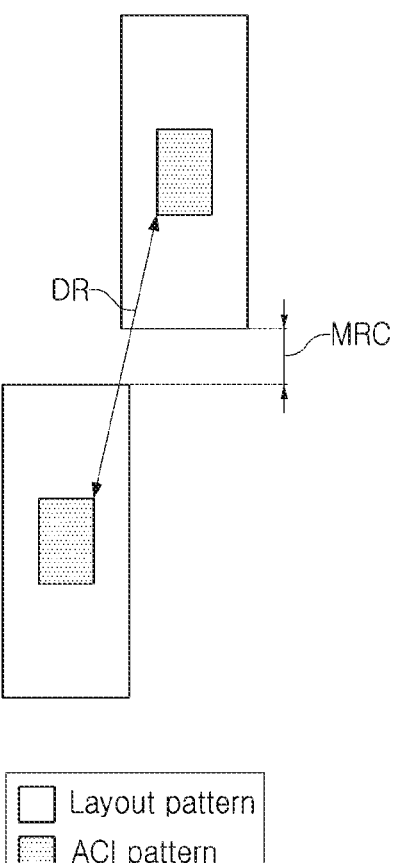
FIGS. 8A and 8B are views illustrating a comparison between a rectangular layout pattern and a modified layout pattern according to an example embodiment.

FIG. 8A illustrates rectangular layout patterns and ACI patterns formed by the layout patterns. In an example of FIG. 8A, layout patterns adjacent to each other in a diagonal direction may be disposed so as not to violate a mask rule. When the layout patterns are disposed so as not to violate the mask rule, it may be difficult to reduce a gap DR between the ACI patterns disposed in the diagonal direction.

Figure 8B:
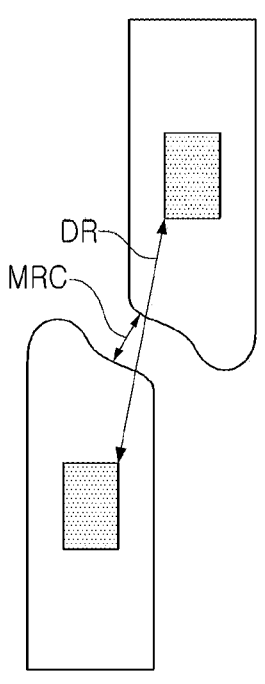
Figure 8B:
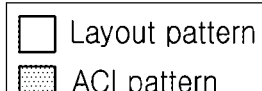

FIG. 8B illustrates modified layout patterns and ACI patterns formed by the layout patterns according to an example embodiment. According to an example embodiment, each of the pair of adjacent edges is transformed into a curved edge, so that a modified layout pattern may have a shape in which a portion disposed to be relatively close to the adjacent layout is reduced and a portion disposed to be relatively distant from the adjacent layout is expanded. When FIG. 8B and FIG. 8A are compared with each other, since a gap between the corner of each ACI pattern and the edge of the layout pattern may be reduced, ACI patterns disposed in a diagonal direction may be disposed to be closer thereto. Accordingly, in the design rule, a gap of the ACI patterns in the diagonal direction may be reduced, and semiconductor devices may be highly integrated on the wafer.

Figure 9A:
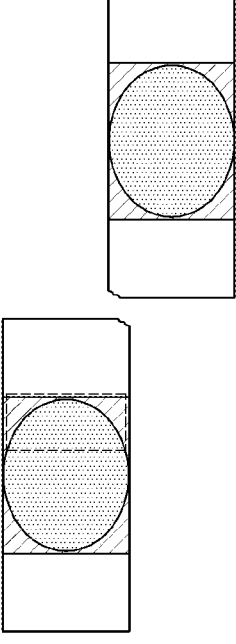
FIGS. 9A and 9C are views illustrating a comparison between a contour of a pattern formed on a wafer by a layout pattern according to a comparative example and a contour of a pattern formed on a wafer by a layout pattern according to an example embodiment.
Figure 9B:
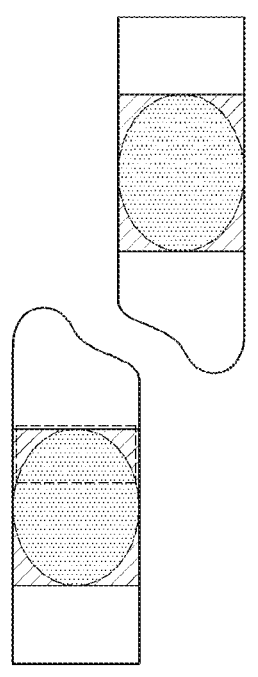
Figure 9C:
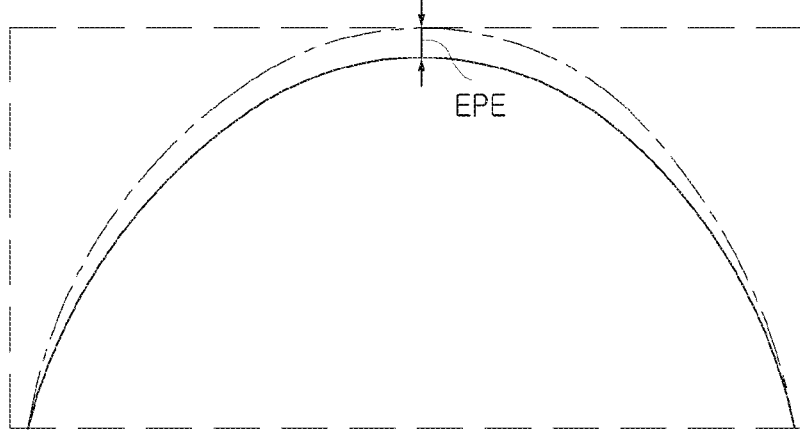

FIGS. 9A and 9C are views illustrating a comparison between a contour of a pattern formed on a wafer by a layout pattern according to a comparative example and a contour of a pattern formed on a wafer by a layout pattern according to an example embodiment.

FIG. 9A illustrates a contour of a transfer circuit pattern which may be formed by a layout pattern, a target pattern, and a layout pattern according to the comparative example as described with reference to FIG. 4B. FIG. 9B illustrates a contour of a transfer circuit pattern which may be formed by a layout pattern, a target pattern, and a transfer circuit pattern according to an example embodiment. In FIGS. 9A and 9B, each of the contours may be predicted through a simulation.

FIG. 9C is an enlarged view of overlapping regions illustrated by dashed lines of FIGS. 9A and 9B to compare the contours of transfer circuit patterns formed by the layout patterns according to the comparative example and an example embodiment.

Referring to FIG. 9C, a size of the contour according to the comparative example may not reach a size of a target pattern. According to the comparative example, an area of the layout pattern is reduced by cutting a portion of the layout pattern, so that the amount of light which may reach a wafer through the layout pattern in an exposure process of the wafer is insufficient. FIG. 9C illustrates a size of EPE of the contour according to the comparative example.

Meanwhile, according to an example embodiment, a portion disposed to be relatively distant from an adjacent layout pattern may be expanded in the layout pattern to maintain an entire area of the layout pattern, so that a sufficient amount of light may reach a wafer and the contour may be formed to have a size appropriate to a size of the target pattern. For example, a size of EPE of the layout patterns formed according to an example embodiment may be reduced.

Figure 10A:
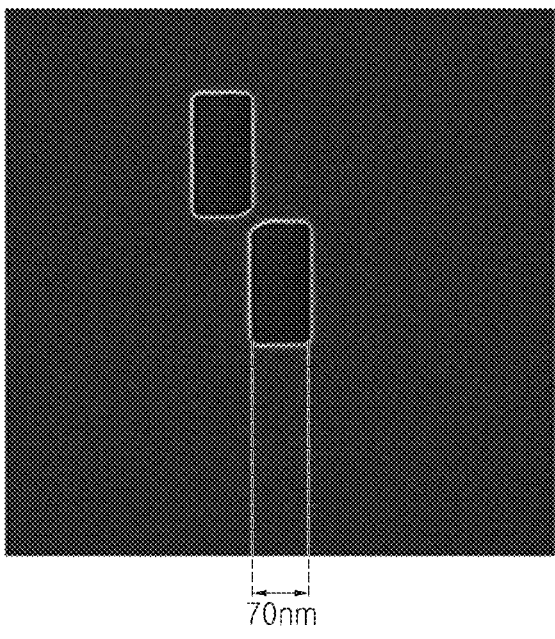
FIGS. 10A and 10B are mask layout images according to a comparative example and an example embodiment.
Figure 10B:
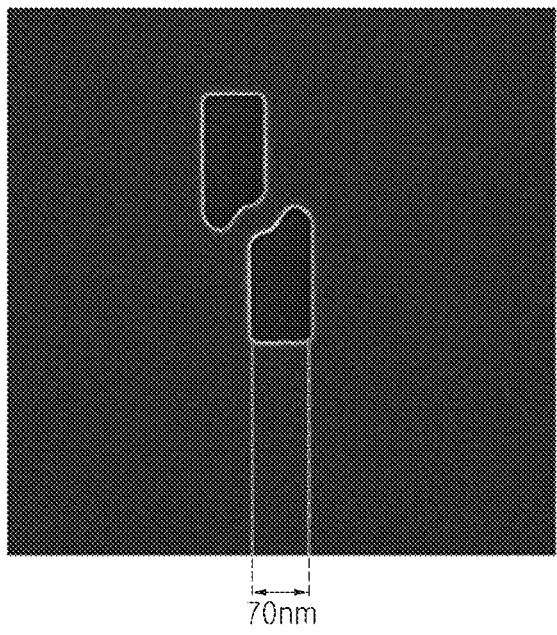

FIGS. 10A and 10B are images of mask layout patterns according to a comparative example and an example embodiment.

FIG. 10A is an image of a layout pattern in which some corners of rectangular layout patterns are cut as described with reference to FIG. 4B, and FIG. 10B is an image of a layout pattern in which a pair of edges are modified to be curved edges according to an example embodiment. The layout patterns of FIGS. 10A and 10B may be layout patterns for forming a target pattern having a horizontal length of 70 nm.

Figure 11A:
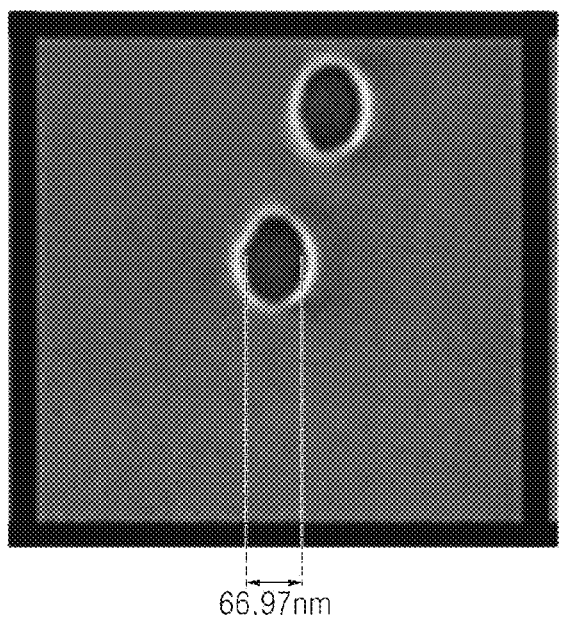
FIGS. 11A and 11B are images, respectively illustrating a transfer circuit pattern formed on a wafer based on a layout pattern according to a comparative example and a transfer circuit pattern formed on a wafer based on a layout pattern according to an example embodiment.
Figure 11B:
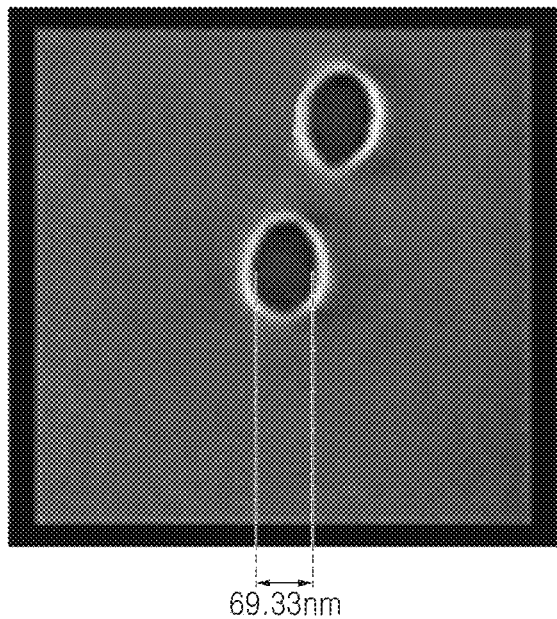

FIGS. 11A and 11B are images, respectively illustrating a transfer circuit pattern formed on a wafer based on a layout pattern according to a comparative example and a transfer circuit pattern formed on a wafer based on a layout pattern according to an example embodiment.

FIG. 11A illustrates a transfer circuit pattern formed by the layout pattern according to the comparative example of FIG. 10A. Referring to FIG. 11A, a horizontal length of the transfer circuit pattern formed on a wafer according to the comparative example may be 66.97 nm. The horizontal length of the transfer circuit pattern according to the comparative example may be less than 70 nm of the target pattern by about 3 nm. For example, a size of EPE in an After Development Inspection (ADI) pattern according to the comparative example may be about 3 nm.

FIG. 11B illustrates a transfer circuit pattern formed by the layout pattern according to the example embodiment of FIG. 10B. Referring to FIG. 11B, a horizontal length of the transfer circuit pattern formed according to an example embodiment may be 69.33 nm. For example, a size of EPE in the transfer circuit pattern according to an example embodiment may be about 0.7 nm. According to an example embodiment, the size of the EPE may be reduced as compared with the comparative example, and the size of the transfer circuit pattern may be close to a size of a target pattern.

Figure 12A:
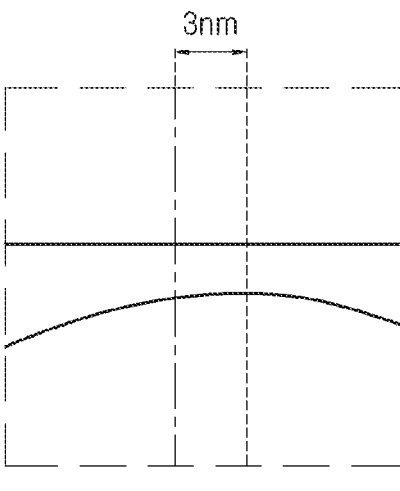
FIGS. 12A and 12B are images illustrating a pattern formed on a wafer based on a layout pattern according to a comparative example and a pattern formed on a wafer based on a layout pattern according to an example embodiment, respectively.
Figure 12B:
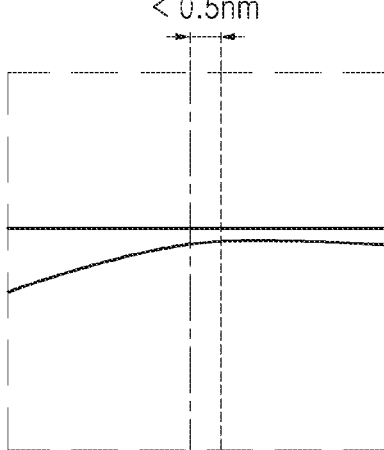

FIGS. 12A and 12B are images illustrating a pattern formed on a wafer based on a layout pattern according to a comparative example and a pattern formed on a wafer based on a layout pattern according to an example embodiment, respectively.

FIG. 12A is an enlarged view of an ADI pattern formed based on a layout pattern according to a comparative example as described with reference to FIG. 4B. According to the comparative example, a sufficient amount of light may not be received from a cut corner portion of the layout pattern during an exposure process of a wafer. Because a sufficient amount of light may not be received from a specific corner portion, a size of a transfer circuit pattern may not reach a size of the target pattern and distortion of the transfer circuit pattern may occur. Referring to FIG. 12A, a center axis of a contour of the transfer circuit pattern may deviate by about 3 nm from a center axis of the target pattern.

FIG. 12B is an enlarged view of a transfer circuit pattern formed based on a modified layout pattern according to an example embodiment. According to an example embodiment, a sufficient amount of light may be received from an overall curved edge portion of the layout pattern during an exposure process of a wafer. Referring to FIG. 12B, a center axis having a largest length in a vertical direction in a transfer circuit pattern may be disposed to be close to a center axis of the target pattern within 0.5 nm. Referring to FIG. 12B, because a large amount of light is received in a relatively expanded portion of a curved edge, the contour of the transfer circuit pattern may not be completely symmetrical, but the contour of the transfer circuit pattern may not deviate from the target pattern. Therefore, according to an example embodiment, a size and a position of the transfer circuit pattern may be close to those of the target pattern.

Figure 13:
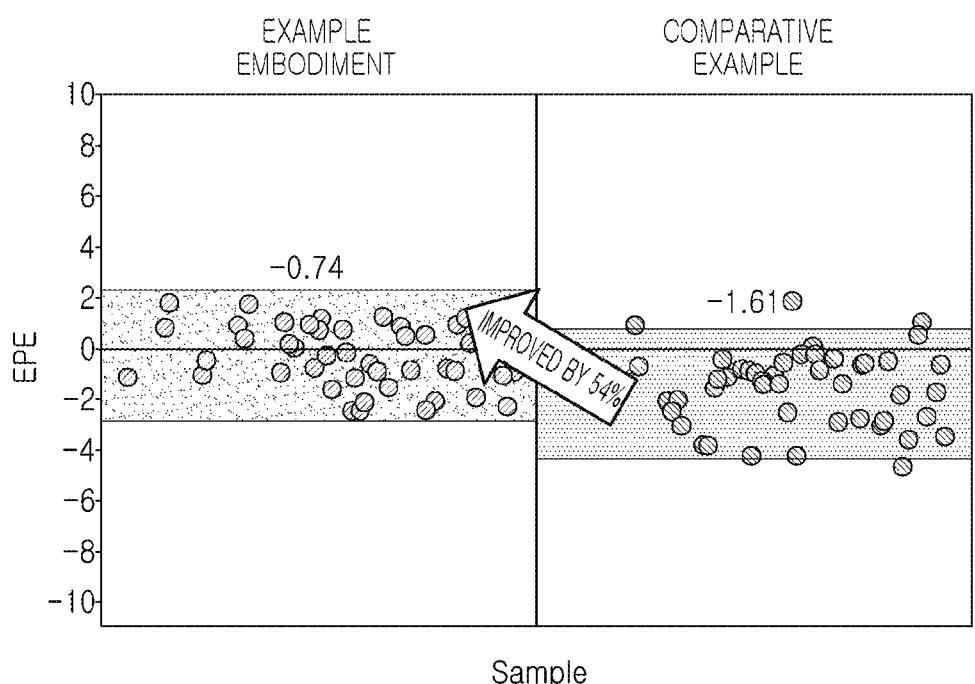
FIG. 13 is a graph for comparing the degree of reduction in size of an EPE based on a layout pattern according to a comparative example with the degree of reduction in size of an EPE based on a layout pattern according to an example embodiment.

FIG. 13 is a graph for comparing the degree of reduction in size of an EPE based on a layout pattern according to a comparative example with the degree of reduction in size of an EPE based on a layout pattern according to an example embodiment.

FIG. 13 is a diagram illustrating an EPE comparison result in the case, in which among layout patterns of a semiconductor chip, a plurality of layout pattern samples violating a mask rule are extracted and a modified layout according to a comparative example is generated for each of the layout pattern samples, and in the case in which a modified layout according to an example embodiment is generated.

Referring to FIG. 13, the EPE of the modified layout according to the comparative example may be −1.61 nm on average. On the other hand, the EPE of the modified layout according to an example embodiment may be −0.74 nm on average. For example, '0.74 nm,' a size of the EPE of the modified layout according to the example embodiment, may be improved by 54%, as compared with '1.61 nm,' a size of the EPE of the modified layout according to the comparative example.

In the OPC method according to an example embodiment described with reference to FIGS. 5 to 13, a target edge violating a mask rule may be detected in a layout pattern, a multi-chip may be formed by dividing a target edge based on a reference control point, additional control points may be set on the multi-edge, and the multi-edge may be transformed into multi-order function curved edges based on the additional control points to form a modified layout pattern.

In the modified layout pattern, in the initial layout pattern, a portion relatively close to an adjacent layout pattern may be contracted, and a portion relatively distant from the adjacent layout pattern may be expanded. Accordingly, the modified layout pattern may satisfy a mask rule in relation to the adjacent layout pattern. In addition, an entire area of the modified layout pattern may be maintained, so that a transfer circuit pattern having a size that matches a size of the target pattern may be formed using the modified layout pattern.

Thus, the size of the EPE of the transfer circuit pattern may be reduced, and a mask rule defining a gap between ACI patterns adjacent to each other in a diagonal direction may be reduced. Accordingly, a semiconductor chip may be highly integrated while forming a pattern having an accurate size and position on a wafer.

In the OPC method according to an embodiment of the present inventive concepts, after first generating a model for predicting CD data based on the center of the slit, apodization tables indicating the intensity for each slit position that is actually occurring in a wafer may be applied to the OPC model. Thereafter, in the OPC method of some example embodiments, the intensity is corrected for each slit position through the corresponding apodization table.

Figure 14:
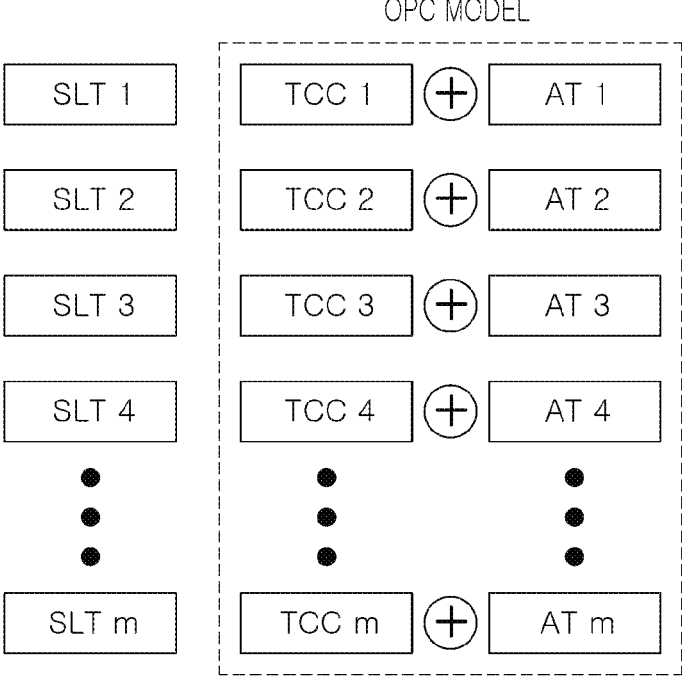
FIG. 14 is a conceptual diagram illustrating a process of generating an OPC model according to an example embodiment.

FIG. 14 is a conceptual diagram illustrating a process of generating an OPC model according to an example embodiment of the present inventive concepts. Referring to FIG. 14, for the slits SLT1 to SLTm (where m is an integer of 2 or greater), an OPC model may be produced using apodization tables (AT1 to ATm) corresponding to transmission cross coefficients (TCCs) (TCC1 to TCCm). In an example embodiment, the TCC may be a transfer function that calculates kernels used in an OPC method. The TCC may include information on a light source and a pupil.

The apodization tables AT1 to ATm may include apodization values according to positions of the slits. In an example embodiment, the apodization values may be values measured for each slit position according to equipment. In another example embodiment, the apodization values may be values of a trend graph using values measured for each slit position.

In general, as patterns are miniaturized, optical proximity effects (OPE) due to influences between neighboring patterns increase/occur during the exposure process. According to the OPC method, the occurrence of OPE may be suppressed by correcting a pattern layout on a mask transferring the pattern.

Figure 15:
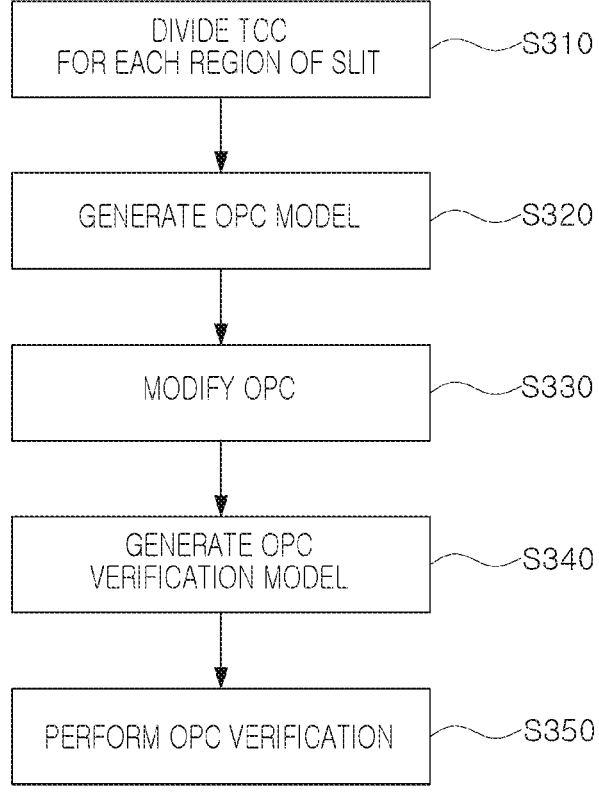
FIG. 15 is a flowchart illustrating an example of an OPC method according to another example embodiment.

FIG. 15 is a flowchart illustrating an OPC method according to another example embodiment. Referring to FIGS. 14 and 15, the OPC method may include a method of correcting a pattern layout on a mask used in an EUV exposure process.

A transmission cross coefficient (TCC) may be divided for each slit region (S310). Because the EUV exposure process uses a wavelength of less than 22 nm, for example, a short wavelength of 13.5 nm, the diffraction phenomenon is not large. Accordingly, compared to OPC in the conventional DUV exposure process using 193 nm, the proportion of OPC to the diffraction phenomenon may not be large. On the other hand, the EUV exposure process may cause a flare effect due to defects such as a mirror or a shadowing effect caused by a thickness of a mask pattern. An OPC method reflecting such a flare effect or shadowing effect is beneficial for the EUV exposure process. For example, the flare effect is caused by scattering of light depending on surface roughness of a mirror. The flare effect may be more pronounced in EUV with shorter wavelengths because scattering is inversely proportional to the square of the wavelength. In the EUV exposure process, the following problems may be caused in relation to light being incident at 6 degrees from the normal. For example, in the DUV exposure process, the slit has a rectangular structure, but in the EUV exposure process, the slit may have a circular arc structure having a desired (or alternatively, predetermined) curvature. When the light incident at 6 degrees from the normal passes through the curved slit of the arc structure, an azimuth angle thereof may vary depending on the position of the slit. Accordingly, the intensity and phases of the light passing through the slit may vary depending on the position of the slit. This may cause a CD error. The occurrence of the CD error depending on the position of the slit may cause an error in the TCC, and thus may cause an error in the OPC method or an OPC model accordingly.

Conventionally, because the slit used in the DUV exposure process has a rectangular, linear structure, there is no change in the azimuth angle of the light passing through the slit, and aberration depending on the position of the slit may rarely occur. Therefore, there is no problem even when the OPC is performed by calculating only the TCC of the central region of the slit and reflecting the same TCC in the entire region. However, in the case of the EUV exposure process, since a curved slit having an arc structure is used, the TCC varies depending on the position of the slit. When the OPC method is performed by calculating the TCC of only the central region of the slit as in the conventional DUV exposure process, an accurate OPC model may not be generated. Such an inaccurate OPC model may cause a defect in the pattern of the EUV mask, and thus a large number of defective chips may be manufactured to reduce the yield of the entire semiconductor process.

In the EUV exposure process, when OPC is performed using only the central TCC despite the curved slit shape, errors may occur in EUV mask patterns in a portion corresponding to an edge of the slit and in chips corresponding thereto. An error caused by the slit structure is called a slit error or a scanner error. Accordingly, in the OPC method, the TCC may be calculated by dividing the TCC for each area of the slit rather than calculating the TCC only at the center of the slit.

A profile of a mask pattern may be determined by a contour of a profile function. The profile function may be expressed by the convolutional integral of an image intensity and the Gaussian function. By calculating the kernels of the TCC, the image intensity may be calculated to generate an OPC model for the mask pattern profile. Dividing the TCC may include a process calculating the TCC for each region of the slit by dividing the slit into regions. In an example embodiment, the TCC may be divided using at least one of an aberration, a phase, an intensity, a polarity, and an apodization value depending on the coordinates of the slit.

After dividing TCC for each slit region, an OPC model may be generated by reflecting the divided TCC (S320). The TCC for each region of the slit is reflected in each region of the slit to generate OPC models for each region of the slit. Because the CD is present depending on the position of the slit, the TCC for each region of the slit may vary. Accordingly, the OPC models of each region of the slit may also vary.

After generating the OPC model, OPC may be performed (S330). The OPC may be performed by the OPC method described with reference to FIGS. 1 to 13. According to an example embodiment, a target edge violating a mask rule may detected in a layout pattern, a multi-edge may be formed by dividing the target edge based on a reference control point, additional control points may set on the multi-edge, and the multi-edge may be transformed into multi-order function curved edges based on the additional control points to form a modified layout pattern.

In an example embodiment, OPC correction corresponding to each of the slits SLT1 to SLTm may be performed using the apodization tables AT1 to ATM. After correcting the OPC, an OPC verification model may be generated (S340). The OPC verification model may be a result of correcting the OPC. After generating the OPC verification model, OPC verification may be performed (S350). OPC verification may perform a simulation based on the OPC verification model. Such OPC verification may include a process of checking whether a mask pattern obtained through the simulation matches a target mask pattern.

OPC verification may be a verification whether OPC correction has been properly performed through a simulation contour of a pattern. For example, when the simulation contour through the OPC verification model is within an error tolerance, the OPC method may be completed, and a mask tape-out (MTO) operation may be performed. When the simulation contour through OPC verification is outside of the error tolerance, OPC is re-corrected through parameter correction such as model adjustment, OPC recipe, and bias, and OPC verification is performed again by creating an OPC verification model. The MOT may include requesting mask production by handing over the mask design data for which the OPC method is completed. Accordingly, the mask design data on which the OPC method is completed may be referred to as MTO design data.

In the OPC method according to an example embodiment, the TCC may be divided for each slit region, an OPC model may be generated by reflecting the divided TCC, and OPC correction is performed according to the apodization value, thereby manufacturing an EUV mask correcting a pattern error of a portion corresponding to a slit edge caused by a slit effect. In addition, as the exposure process is performed through the EUV mask, defects of chips in the portion corresponding to the slit edge may be prevented/reduced. A dispersion in the EUV exposure process may be improved and the yield may be significantly improved.

Figure 16:
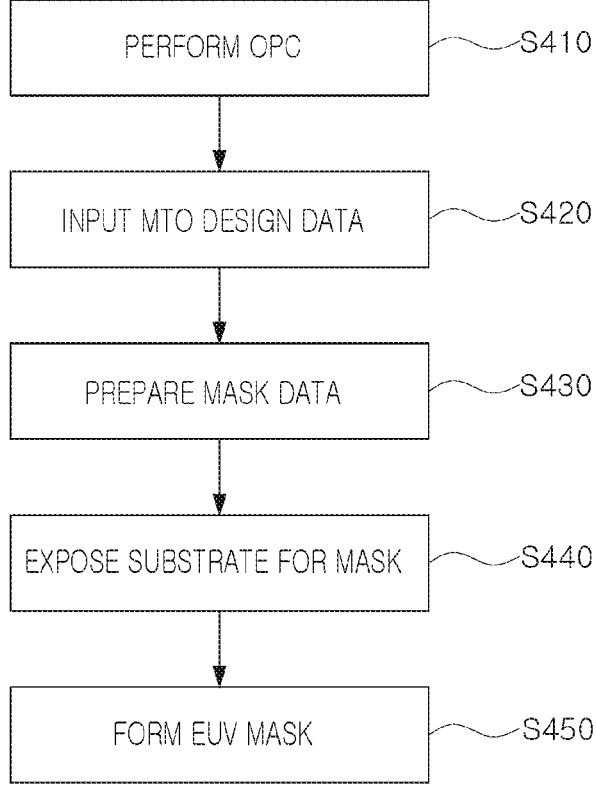
FIGS. 16 to 18 are flowcharts processes of an extreme ultraviolet (EUV) mask manufacturing method according to some example embodiments.

FIG. 16 is a flowchart illustrating a process of a method of manufacturing an EUV mask according to an example embodiment of the present inventive concepts. Referring to FIG. 16, OPC is performed (S410). The TCC may be divided for each region of the slit, an OPC model may be generated by reflecting the divided TCC, and OPC may be performed based on an apodization table and the OPC model. Then, an OPC verification model may be generated to additionally perform a series of processes such as OPC verification.

Performing the OPC in some example embodiments may include detecting a target edge violating a mask rule in a layout pattern, forming a multi-edge by dividing the target edge based on a reference control point, setting additional control points on the multi-edge, and transforming the multi-edge into multi-order function curved edges based on additional control points to generate a modified layout pattern.

In an example embodiment, a transmission cross coefficient (TCC) may be divided for each slit region. In an example embodiment, an apodization value indicating beam intensity for each slit position may be set.

As described above, after performing OPC, MTO design data is input (S420). For example, the MTO may include requesting mask manufacturing by handing over mask design data on which the OPC operation has been completed. Accordingly, the MTO design data may be considered as mask design data on which the OPC operation has been completed. The MTO design data may have a graphic data format used in electronic design automation (EDA) software or the like. For example, the MTO design data may have a data format such as graphic data system (GDS2), open artwork system interchange standard (ASIS), or the like.

After receiving the MTO design data, mask data preparation (MDP) is performed (S430). Mask data preparation may include, for example, format conversion known as fracturing, augmentation of barcodes for mechanical reading, standard mask patterns for inspection, job-decks, and the like, and verification of automatic and manual methods. The job-deck may include creating a text file related to a series of instructions, such as arrangement information of multiple mask files, a reference dose, and an exposure speed or method.

The format conversion (e.g., fracturing) may include a process of dividing the MTO design data for each region and changing the divided MTO design data to a format for an electron beam exposure machine. For example, fracturing may include data operations such as scaling, data sizing, data rotation, pattern reflection, and color inversion. In the conversion process through fracturing, data for numerous systematic errors that may occur during the transfer process from design data to an image on a wafer may be corrected. A data correction process for these systematic errors is called mask process correction (MPC). For example, the data correction process may include CD adjustment, which includes adjusting a line width and increasing precision of pattern arrangement. In addition, it may be a process performed in advance for mask process correction. Here, systematic errors may be caused by distortion occurring in exposure, mask development, and/or etching and wafer imaging processes.

The mask data preparation may include the aforementioned MPC. MPC refers to a process of correcting an error occurring during an exposure process, for example, a systematic error. Here, the exposure process may refer to the MPC process that includes electron beam writing, developing, etching, and baking. In addition, data processing may be performed prior to the exposure process. Data processing is a type of preprocessing process for mask data, and may include grammar check for mask data, prediction of exposure time, and the like.

After preparing the mask data, a substrate for a mask is exposed based on the mask data (S440). The exposure may include, for example, electron beam writing. Here, the electron beam writing may be performed by, for example, a gray writing method using a multi-beam mask writer (MBMW). In addition, the electron beam writing may be performed using a variable shape beam (VSB) exposure machine.

After the mask data preparation operation, a process of converting the mask data into pixel data may be performed before the exposure process. The pixel data is data directly used for actual exposure, and may include data regarding a shape to be exposed and data regarding a dose assigned to each data. The shape data may be bitmap data in which shape data (e.g., vector data) is converted through rasterization or the like.

After the exposure process, a mask is formed by performing a series of processes (S450). The series of processes may include, for example, development, etching, and cleaning. In addition, the series of processes for forming the mask may include a measurement process, a defect inspection process, or a defect repair process. In addition, a pellicle application process may also be included. The pellicle application process may include a process of attaching a pellicle to a mask surface to protect the mask from subsequent contamination during a delivery of the mask and a useful life of the mask when it is confirmed that there are no contaminating particles or chemical stains through final cleaning and inspection.

Figure 17:
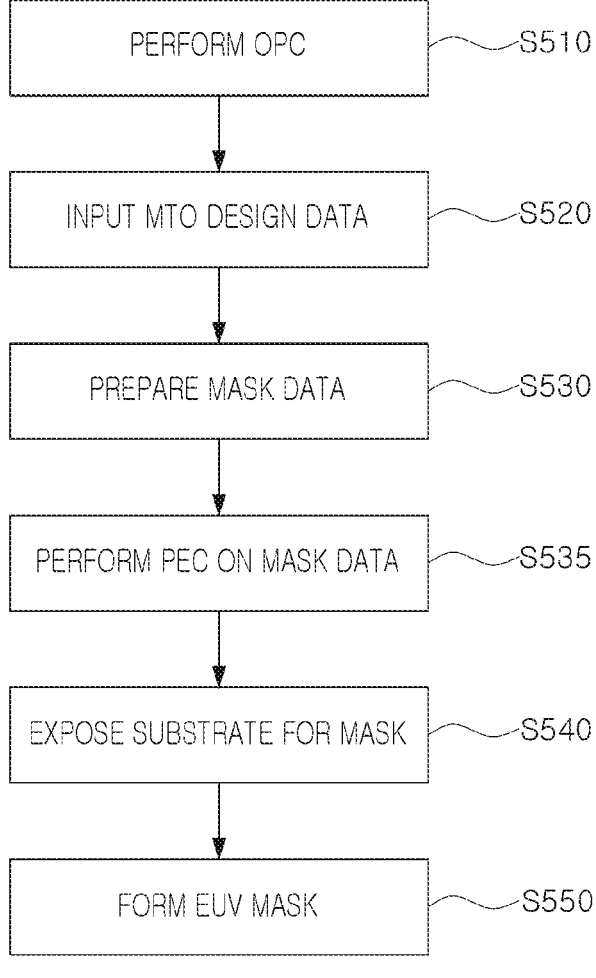

FIG. 17 is a flowchart illustrating a method of manufacturing an EUV mask according to another example embodiment. Referring to FIG. 17, the method of manufacturing an EUV mask is similar to that of FIG. 16, but may further include an operation S535 of performing proximity effect correction (PEC) on the mask data after an operation S520 of inputting MTO design data and an operation S530 of preparing mask data. Such a PEC refers to a process of correcting an error caused by electron beam proximity effect (e.g., electron beam scattering). For example, in the electron beam exposure process, a phenomenon in which a high acceleration voltage used to generate an electron beam scatters together with the atoms of a resist and a material located therebelow as high kinetic energy is applied to electrons, and such a phenomenon is commonly referred to as the electron beam proximity effect. The electron beam proximity effect may be modeled with two Gaussian functions or an empirically determined proximity function, and the electron beam proximity effect may be corrected based on those functions.

A proximity effect correction most commonly used to correct an error caused by the electron beam proximity effect is a method of compensating for a dose changed due to scattering by changing a dose during an actual exposure. For example, a region with a high pattern density may be assigned a relatively low dose, and relatively isolated and small shapes may be assigned a relatively high dose. Here, the dose may include an irradiation amount of the electron beam. The proximity effect correction may include a method of correcting an edge of a pattern shape or changing a size of the pattern shape. After performing PEC, an EUV mask is manufactured by performing an operation (S540) of exposing a substrate for a mask and an operation (S550) of forming an EUV mask.

Figure 18:
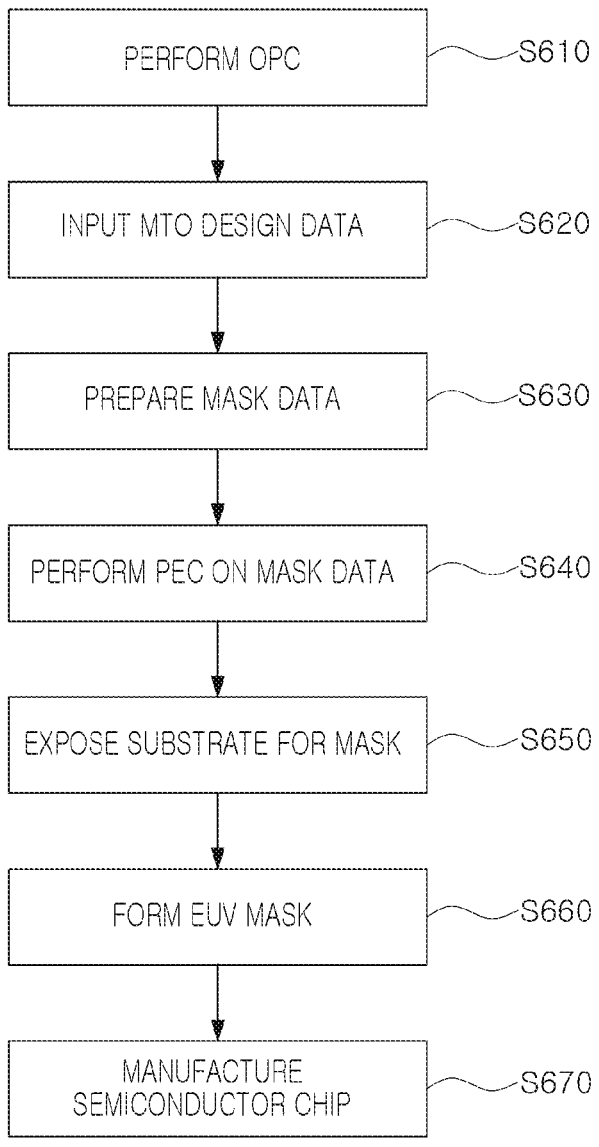

FIG. 18 is a flowchart illustrating a method of manufacturing a semiconductor chip/device according to an example embodiment of the present inventive concepts. Referring to FIG. 18, an EUV mask may be manufactured by performing an operation (S660) of forming an EUV mask after performing a series of operations S610 to S650 illustrated in FIG. 17. When the EUV mask is manufactured, various semiconductor device/chip manufacturing processes may be performed on a semiconductor substrate such as a wafer using the manufactured EUV mask to form a semiconductor device (S670). For reference, the process using an EUV mask may typically include a patterning process through an EUV exposure process. A desired pattern may be formed on a semiconductor substrate or a material layer through the patterning process using the EUV mask.

The semiconductor process may include a deposition process, an etching process, an ion process, a cleaning process, and the like. The deposition process may include various material layer forming processes such as chemical vapor deposition (CVD), sputtering, spin coating, and the like. The ion process may include processes such as ion implantation, diffusion, heat treatment, and the like. The semiconductor process may further include a packaging process, in which a semiconductor device is mounted on a PCB and sealed with a sealing material, and a test process of testing a semiconductor device or package.

According to an example embodiment, edges violating a mask rule may be detected in an initial rectangular layout pattern, the edges may be transformed into a multi-edge, and generating a modified layout pattern in which the multi-edge is transformed into curved edge depending on a Bezier curve or a B-spline curve based on additional control points on the multi-edge. In the modified layout pattern, a portion disposed to be relatively close to an adjacent layout pattern with respect to a reference control point may have a contracted shape, and a portion disposed to be relatively distant from the adjacent layout pattern may have an expanded shape.

According to an example embodiment, because a position of a reference control point, shapes of a multi-edge, and a position of additional control points for forming a modified layout pattern may be variously determined, modified layout patterns having various shapes may be formed. An optimal layout pattern for forming a target pattern may be determined by iteratively performing an operation of generating the modified layout patterns having various shapes and calculating an EPE of the modified layout patterns several times.

According to an example embodiment, a modified layout pattern having various shapes may be formed. Therefore, even when a mask for forming via patterns or metal contact patterns disposed in an irregular pattern is manufactured, a mask layout patterns may be effectively formed on the mask. For example, when an OPC method according to an example embodiment is used, layout patterns for highly integrating a memory cell peripheral circuit having via patterns and metal contact patterns may be formed in response to a request to reduce a size of a DRAM chip.

As described above, in an optical proximity correction method according to an example embodiment and a method of manufacturing a mask and a method of manufacturing a semiconductor chip using the optical proximity correction method, an edge violating a mask rule in a layout pattern on a mask is transformed into a Bezier curve, a B-spline curve, or the like, and thus, rule violation may be avoided, devices may be highly integrated on a semiconductor wafer, and a size of an EPE of the layout pattern may be reduced.

Although not specifically illustrated, all of the methods described above (e.g., the methods illustrated in the flowcharts of FIGS. 3, 7, 15, 16 and 17) include or go to a completion of manufacturing of semiconductor chips.

While some example embodiments have been shown and described above, it will be apparent to those skilled in the art that modifications and variations could be made without departing from the scope of the present inventive concepts as defined by the appended claims.

What is claimed is:

1. An optical proximity correction (OPC) method for manufacturing a semiconductor chip, the OPC method comprising:

detecting edges of an initial layout pattern and determining an edge violating a mask rule, among the edges, as a target edge, wherein the determining the edge violating the mask rule as the target edge comprises:

checking whether an adjacent layout pattern is within a defined distance from a corner of the initial layout pattern, and determining an edge having a distance from an edge of the adjacent layout pattern that is smaller than a distance defined in the mask rule, among the edges, as the target edge;

setting a reference control point on the target edge;

based on determining that the target edge violates the mask rule, forming a multi-edge by dividing the target edge at the reference control point;

setting additional control points on the multi-edge;

forming a modified layout pattern by transforming the multi-edge into a curved edge based on the reference control point and the additional control points;

performing an OPC simulation based on the modified layout pattern;

calculating an edge placement error (EPE) of the modified layout pattern based on a result of the OPC simulation;

iteratively performing moving the reference control point on the target edge and the forming the multi-edge by dividing the target edge at the moved reference control point, the setting additional control points, the forming a modified layout pattern, the performing an OPC simulation, and the calculating an EPE, for a set number of iterations; and determining a final layout pattern based on EPE calculation results.

2. The OPC method of claim 1, wherein the setting a reference control point on the target edge comprises setting a center of the target edge as the reference control point.

3. The OPC method of claim 1, wherein the dividing the target edge comprises:

dividing the target edge into first and second edges, adding a rectangle in contact with the first edge to the initial layout pattern, and cutting a rectangle in contact with the second edge from the initial layout pattern to form the multi-edge.

4. The OPC method of claim 3, wherein the dividing the target edge comprises determining an edge of the initial layout pattern that is closer to the adjacent layout pattern, among the first and second edges, as the second edge.

5. The OPC method of claim 1, wherein the forming a modified layout pattern comprises generating a Bezier curve or a B-spline curve based on the reference control point and the additional control points to transform the multi-edge into the curved edge.

6. The OPC method of claim 1, wherein the calculating an EPE of the modified layout pattern comprises comparing a size of a target pattern to be formed by the modified layout pattern with a size of a contour formed based on the result of the OPC simulation.

7. The OPC method of claim 1, wherein the modified layout pattern has a shape in which a portion relatively close to the adjacent layout pattern is contracted, and a portion relatively distant from the adjacent layout pattern is expanded.

* * * * *